(12) United States Patent
Zheng et al.

(10) Patent No.: US 10,034,419 B2
(45) Date of Patent: Jul. 24, 2018

(54) DETACHING APPARATUS FOR DETACHING COMPONENT FROM CIRCUIT BOARD

(71) Applicants: HONGFUJIN PRECISION ELECTRONICS (ZHENGZHOU) CO., LTD., Zhengzhou (CN); HON HAI PRECISION INDUSTRY CO., LTD., New Taipei (TW)

(72) Inventors: Jin-Song Zheng, Shenzhen (CN); Jing-Bin Liang, Shenzhen (CN); Hai-Gui Huang, Shenzhen (CN); Lei Han, Shenzhen (CN); Zhi-Yong Liu, Shenzhen (CN); Tian-Sheng Chen, Shenzhen (CN); Dong Li, Shenzhen (CN); Ji-Ke Shan, Shenzhen (CN)

(73) Assignees: HONGFUJIN PRECISION ELECTRONICS (ZHENGZHOU) CO., LTD., Zhengzhou (CN); HON HAI PRECISION INDUSTRY CO., LTD., New Taipei (TW)

(*) Notice: Subject to any disclaimer, the term of this patent is extended or adjusted under 35 U.S.C. 154(b) by 480 days.

(21) Appl. No.: 14/690,813

(22) Filed: Apr. 20, 2015

(65) Prior Publication Data

US 2016/0192549 A1    Jun. 30, 2016

(30) Foreign Application Priority Data

Dec. 29, 2014   (CN) .......................... 2014 1 0832380

(51) Int. Cl.
*H05K 13/04* (2006.01)
*B26D 7/18* (2006.01)
*B26D 5/00* (2006.01)

(52) U.S. Cl.
CPC .......... *H05K 13/0486* (2013.01); *B26D 5/00* (2013.01); *B26D 7/1863* (2013.01); *B26D 7/18* (2013.01)

(58) Field of Classification Search
CPC ...... H05K 13/0486; H05K 13/04; B26D 5/00; B26D 7/1863; B26D 7/18
See application file for complete search history.

(56) References Cited

U.S. PATENT DOCUMENTS

| 4,971,554 A | * | 11/1990 | Moore | .................. | B23K 1/012 228/19 |
| 6,719,188 B2 | * | 4/2004 | Farooq | .................. | B23K 1/018 228/13 |

* cited by examiner

*Primary Examiner* — Peter DungBa Vo
*Assistant Examiner* — John S Lowe
(74) *Attorney, Agent, or Firm* — ScienBiziP, P.C.

(57) ABSTRACT

A detaching apparatus includes a bench, a first supporting member attached to the bench, a convey system, a positioning member, a second supporting member, and a detaching member. The convey system is attached to the first supporting member for conveying a circuit board. The positioning member is attached to the first supporting member for positioning the circuit board. The second supporting member is attached to the bench and aligning with the first supporting member. The detaching member is attached to the second supporting member and includes a sliding bracket moving vertically relative to the bench, a moving block moving horizontally in the sliding bracket, a blade attached to the moving block, and a vacuum suction cup attached to the moving block and aligning with the blade.

9 Claims, 12 Drawing Sheets

DETACHING APPARATUS FOR DETACHING COMPONENT FROM CIRCUIT BOARD

FIELD

The subject matter herein generally relates to a detaching apparatus for detaching electronic components from a circuit board.

BACKGROUND

Electronic components may be manually detached from a circuit board when something wrong with the electronic components. However, it is inefficient.

BRIEF DESCRIPTION OF THE DRAWINGS

Implementations of the present technology will now be described, by way of example only, with reference to the attached figures.

DETAILED DESCRIPTION

Figure 1:
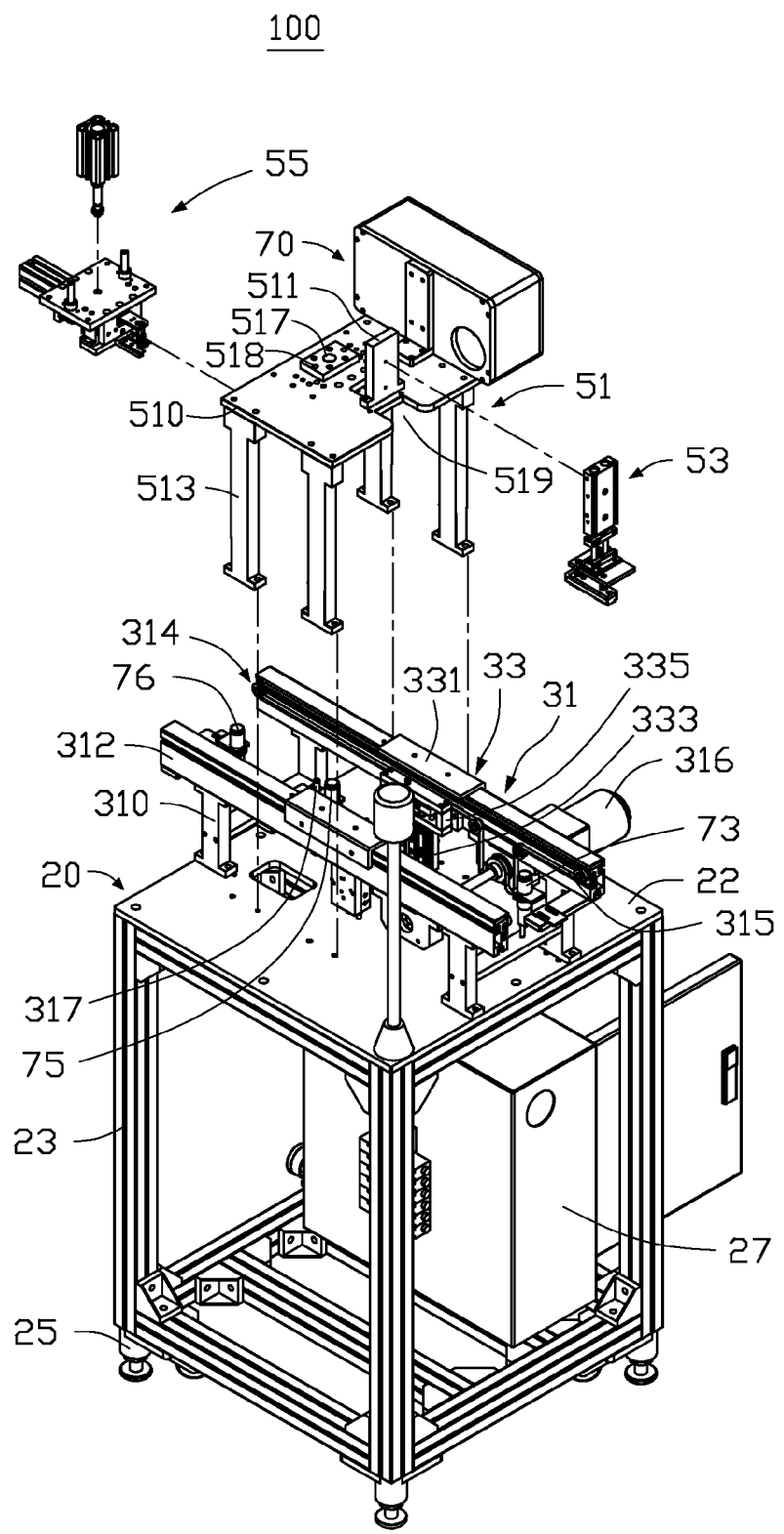
FIG. 1 is an exploded, isometric view of an embodiment of a detaching apparatus, wherein the detaching apparatus includes a locating member and a detaching member.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts can be exaggerated to better illustrate details and features. The description is not to be considered as limiting the scope of the embodiments described herein.

The term "comprising" means "including, but not necessarily limited to"; it specifically indicates open-ended inclusion or membership in a so-described combination, group, series and the like.

The present disclosure is described in relation to a detaching apparatus for detaching components from a circuit board.

Figure 2:
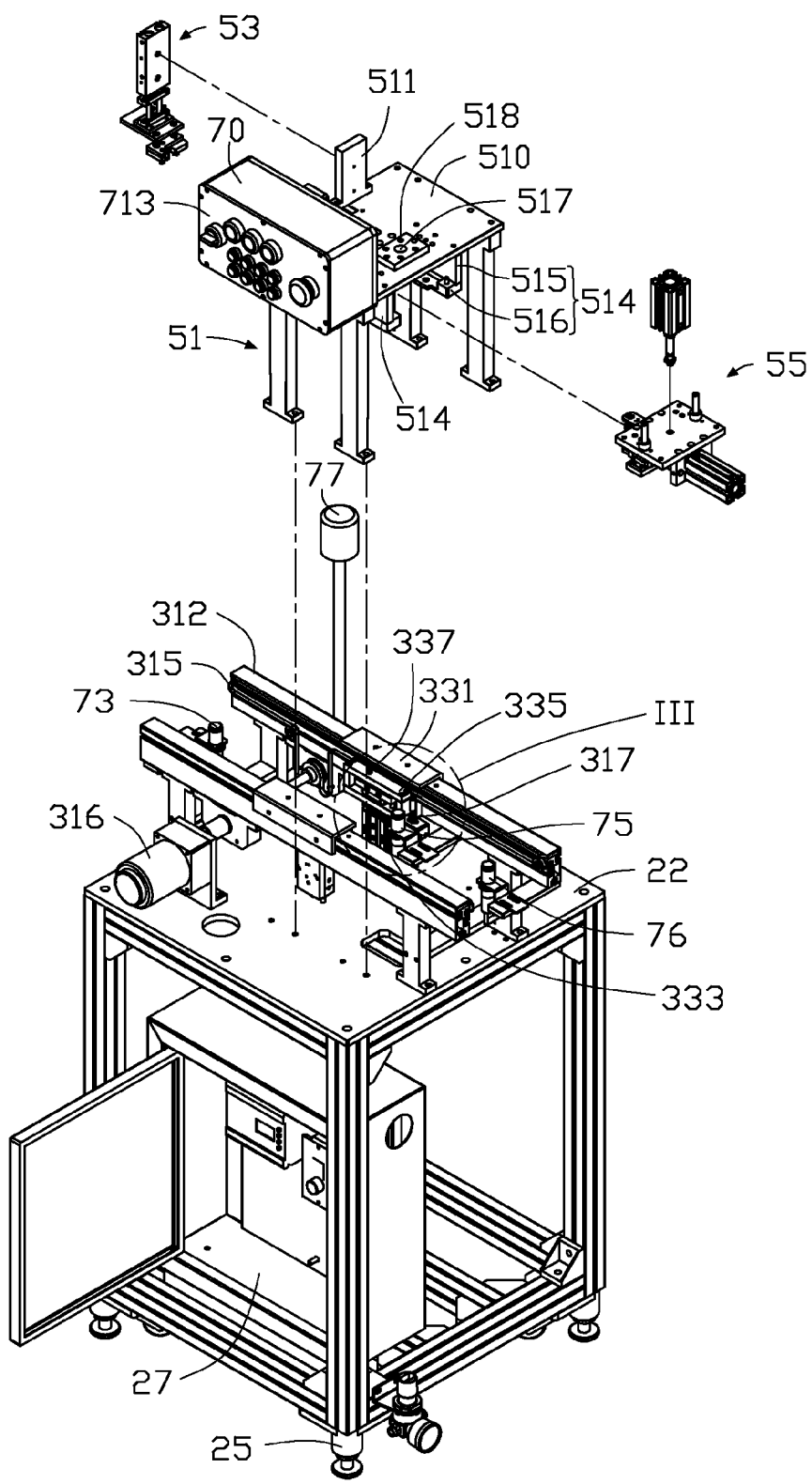
FIG. 2 is similar to FIG. 1, but viewed from another angle.
Figure 3:
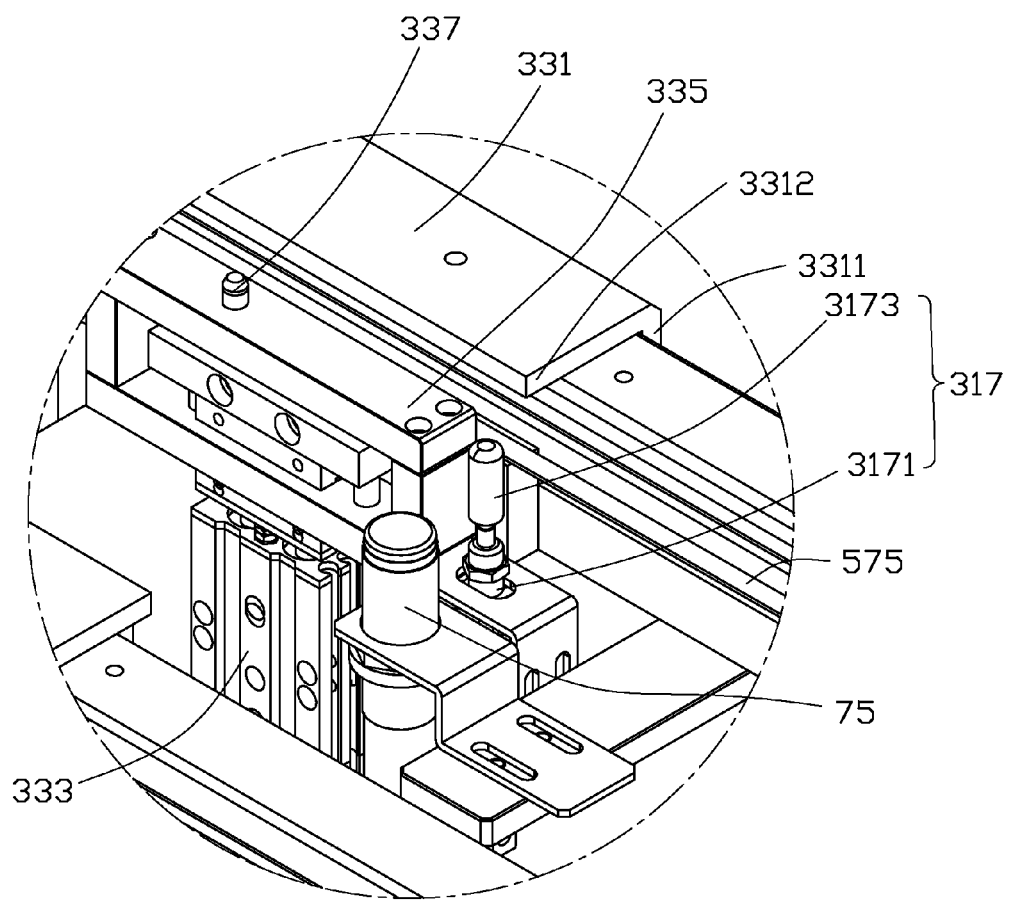
FIG. 3 is an enlarged view of a circled portion III of FIG. 2.
Figure 10:
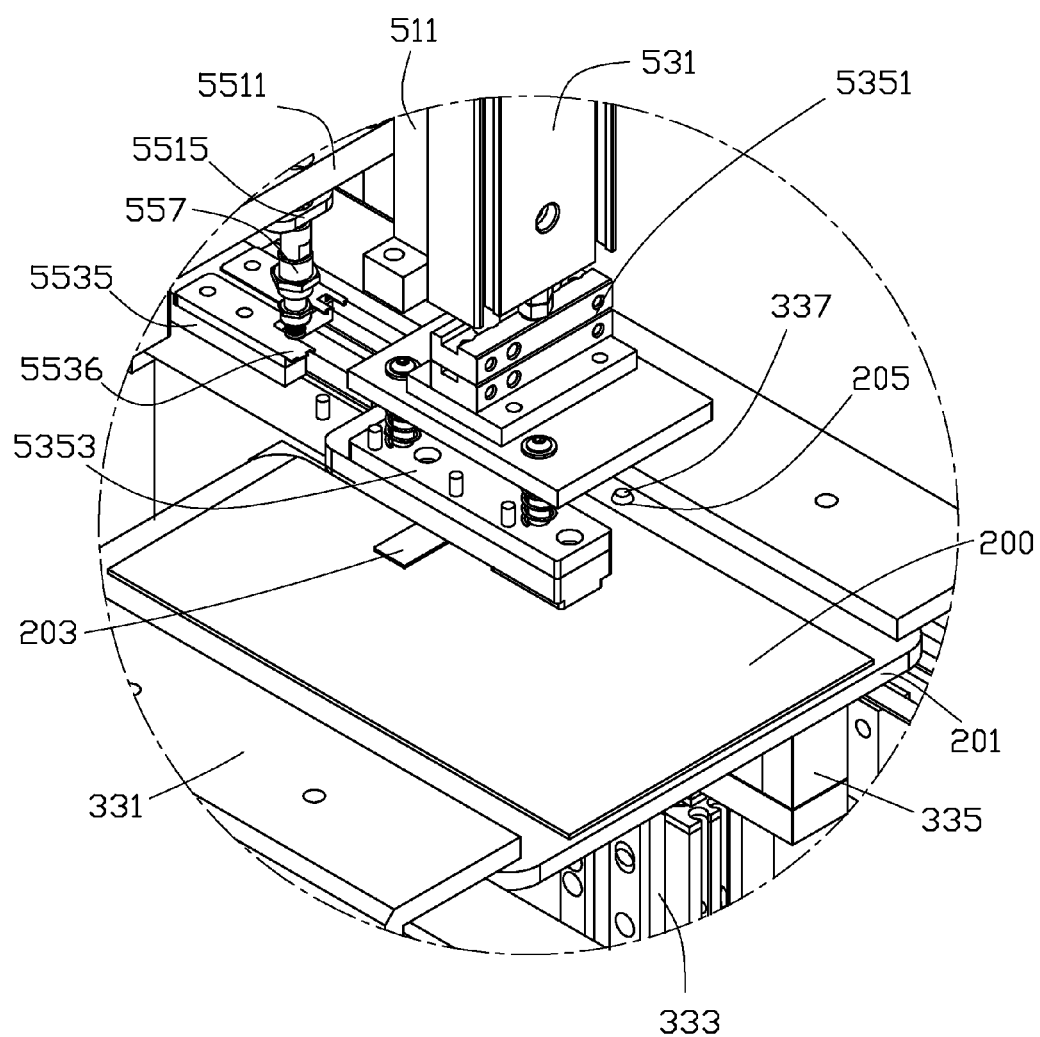
FIG. 10 is an enlarged view of a circled portion X of FIG. 8.
Figure 11:
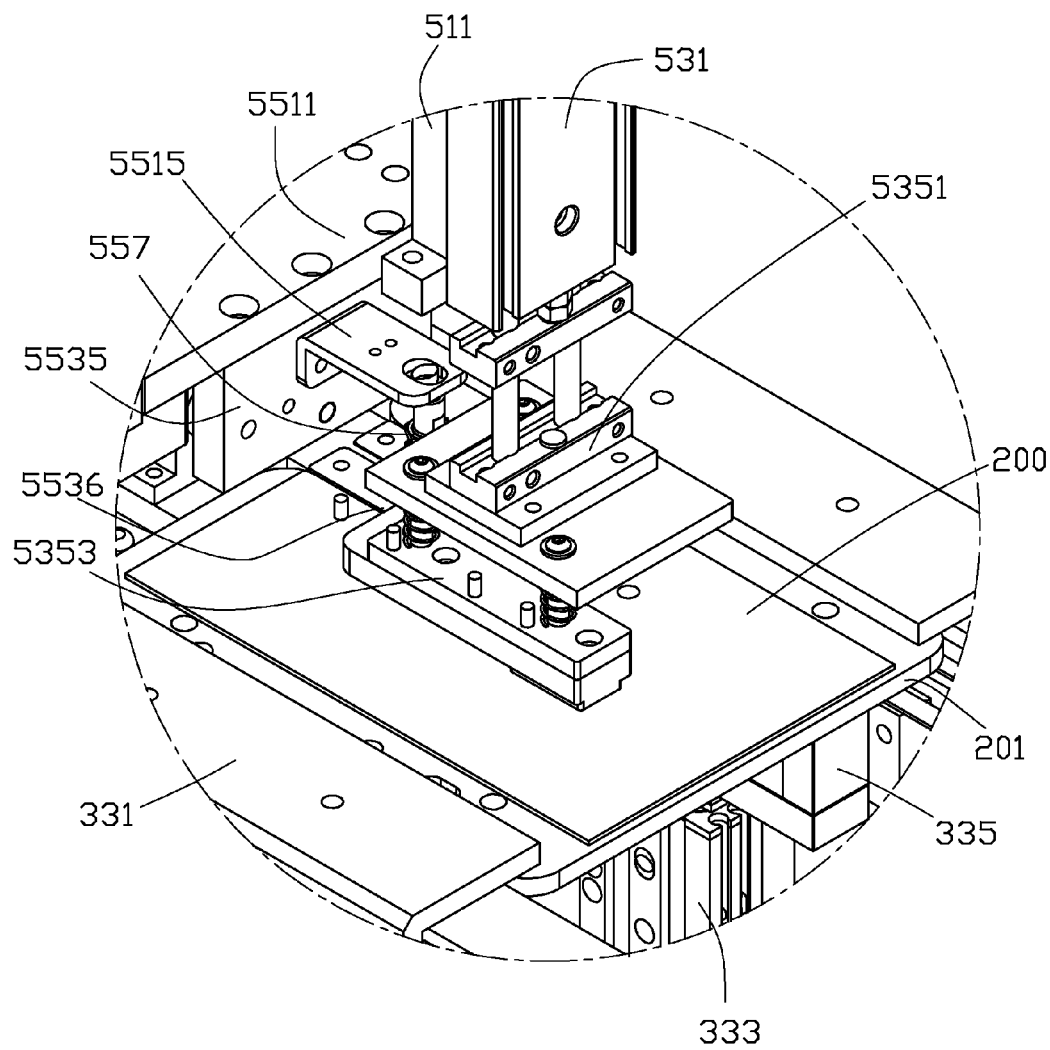
FIG. 11 is an enlarged view of a circled portion XI of FIG. 9.

FIGS. 1-3 illustrate an exploded, isometric view of a detaching apparatus 100 for detaching electronic components 203 from a circuit board 200 (shown in FIG. 10) carried by a tray 201 (shown in FIG. 10). The tray 201 defines two position holes 205 (shown in FIG. 10) located two opposite sides of the tray 201. The detaching apparatus 100 comprises a bench 20, a first supporting member 31, a positioning member 33, a second supporting member 51, a locating member 53, a detaching member 55, a power supply device 27, and a controlling device 70.

The bench 20 comprises a supporting plate 22, a bracket 23 located below the supporting plate 22, and a plurality of supporting foots 25 mounted below the bracket 23. The power supply device 27 is installed in the bracket 23.

The first supporting member 31 comprises a first supporting bracket 310 mounted on the supporting plate 22, two spaced and parallel rails 312 mounted on the first supporting bracket 310, and a convey system 314 attached to rails 312 to move the tray 201. The convey system 314 comprises two convey belts 315 respectively installed to inner sides of the rails 312 driven by a driving member 316 mounted on the supporting plate 22. A first sensor 73, a second sensor 76, and a third sensor 75 are located between the rails 312 and controlled by the control device 70. The first sensor 73 and the second sensor 76 are located near two opposite ends of the rails 312, while the third sensor 75 is located between the first sensor 73 and the second sensor 76.

The positioning member 33 comprises a stopping member 317 driven by a driving cylinder 3171, a pair of L-shaped abutting plates 331 attached to the rails 312, and a pair of abutting blocks 335 driven by a pair of first cylinders 333. The driving cylinder 3171 is mounted on the first supporting bracket 310. The stopping member 317 comprises a stopping bar 3173 capable of moving vertically. The two first cylinders 333 are mounted on the supporting plate 22 and located between the abutting plates 331, to move the abutting blocks 335 vertically. A position pin 337 protrudes from a top surface of each abutting block 335. Each abutting plate 331 comprises a connecting portion 3311 attached to an outside of the rail 312, and an abutting portion 3312 extending perpendicularly from the connecting portion 3311. The two abutting portions 3312 extend each other and are located above the corresponding convey belts 315. The stopping member 317 is located between the rails 312 and adjacent to the third sensor 75. The driving member 316 is powered by the power supply device 27. In the embodiment, the driving member 316 is a servo motor.

The second supporting member 51 comprises an installing plate 510, a plurality of supporting poles 513 connected to a bottom surface of the installing plate 510, and two spaced and opposite connecting plates 514 mounted to a side of the bottom surface of the installing plate 510. Each connecting plate 514 comprises a connecting portion 515 perpendicularly extending down from the bottom surface of the installing plate 510 and an extending portion 516 perpendicularly extending from a distal end of the connecting portion 515 toward the other connecting plate 514. The installing plate 510 defines a guiding hole 517 located between the connecting plates 514 and a plurality of through holes 518 surrounding the guiding hole 517. A middle of a side of the installing plate 510 defines a cutout 519 away from the connecting plates 514 and opposite to the guiding hole 517. A mounting board 511 is mounted perpendicular to the top surface of the installing plate 510 adjacent to the cutout 519.

Figure 4:
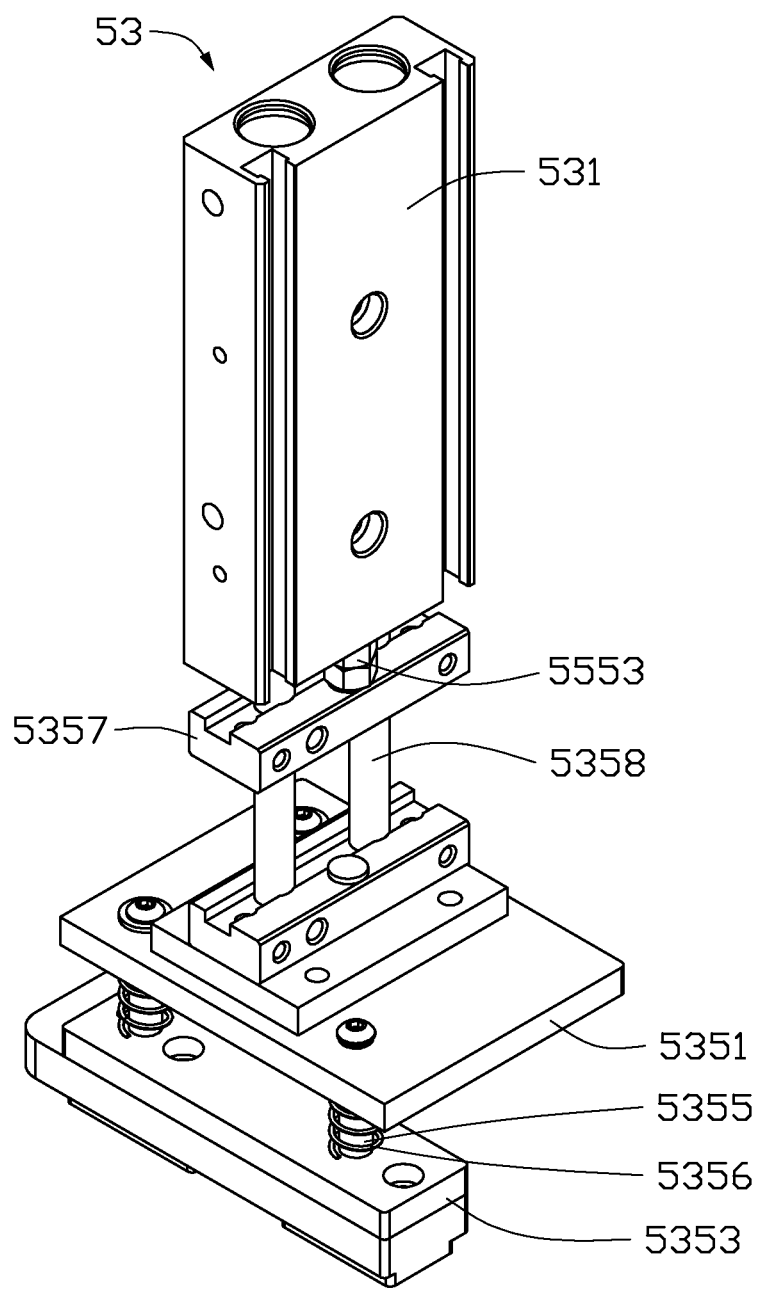
FIG. 4 is an enlarged, isometric view of the locating member of FIG. 1.

FIG. 4 illustrates the locating member 53 comprising a connecting block 5351 driven by a second cylinder 531 via a piston pin 5553, a pressing block 5353, a plurality of guiding pins 5355, a plurality of resilient members 5356, a connecting plate 5357 mounted to a distal end of the piston pin 5553, and two connecting pins 5358 connected between the connecting plate 5357 and the connecting block 5351. The guiding pins 5355 are located between the connecting block 5351 and the pressing block 5353, and the resilient members 5356 are respectively fitted about the guiding pins 5355. A bottom end of each guiding pin 5355 is mounted to the pressing block 5353, and a top end of the guiding pin 5355 is slidably connected to the connecting block 5351 along a vertical direction.

Figure 5:
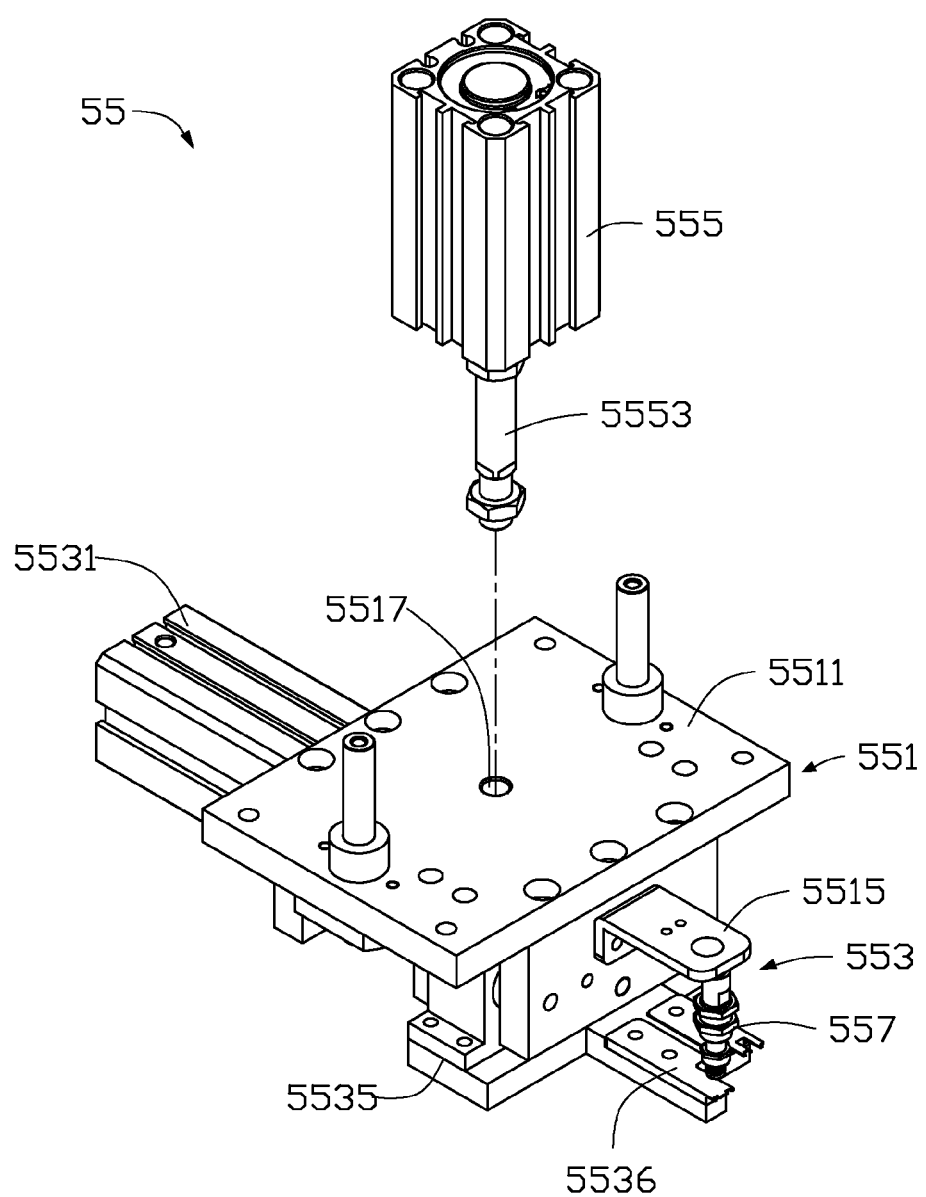
FIG. 5 is an enlarged, isometric view of the detaching member of FIG. 1.
Figure 6:
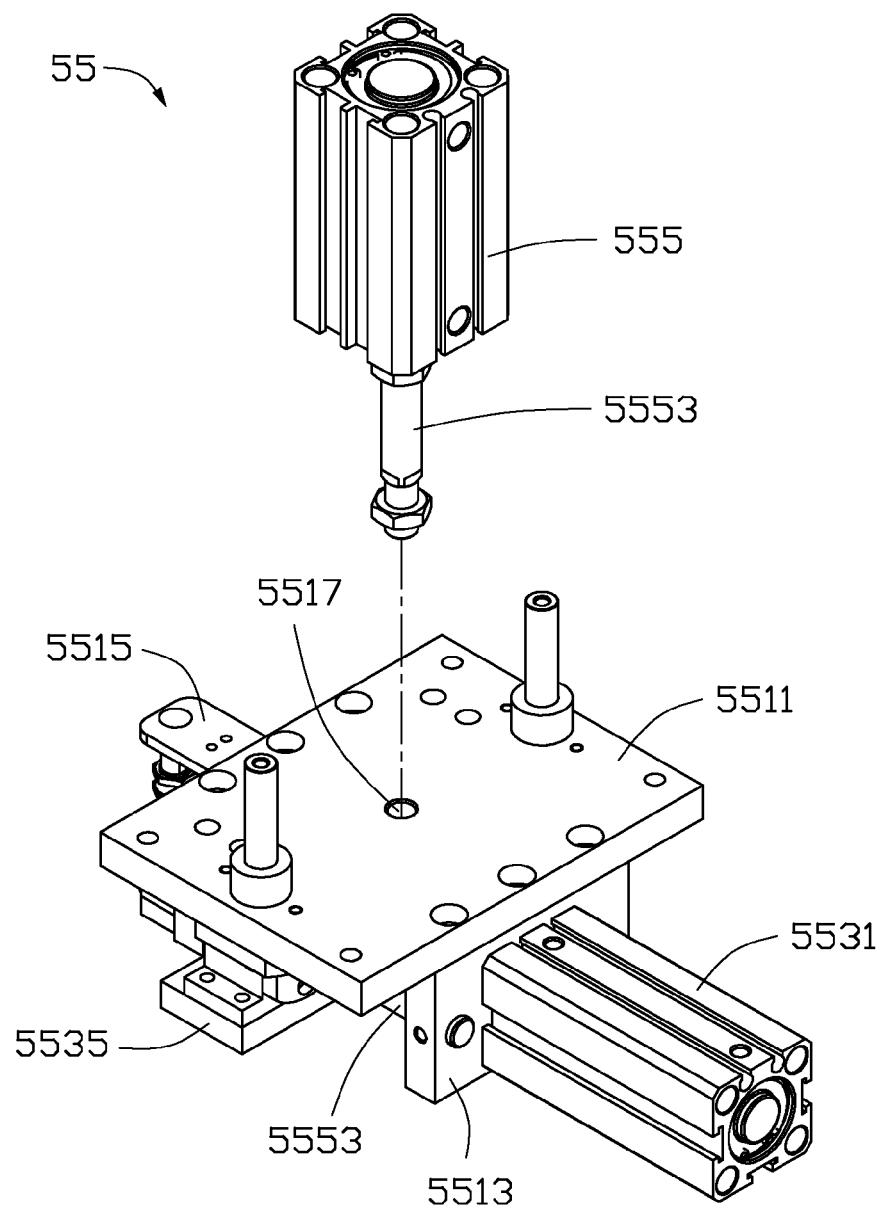
FIG. 6 is similar to FIG. 5, but viewed from another angle.
Figure 7:
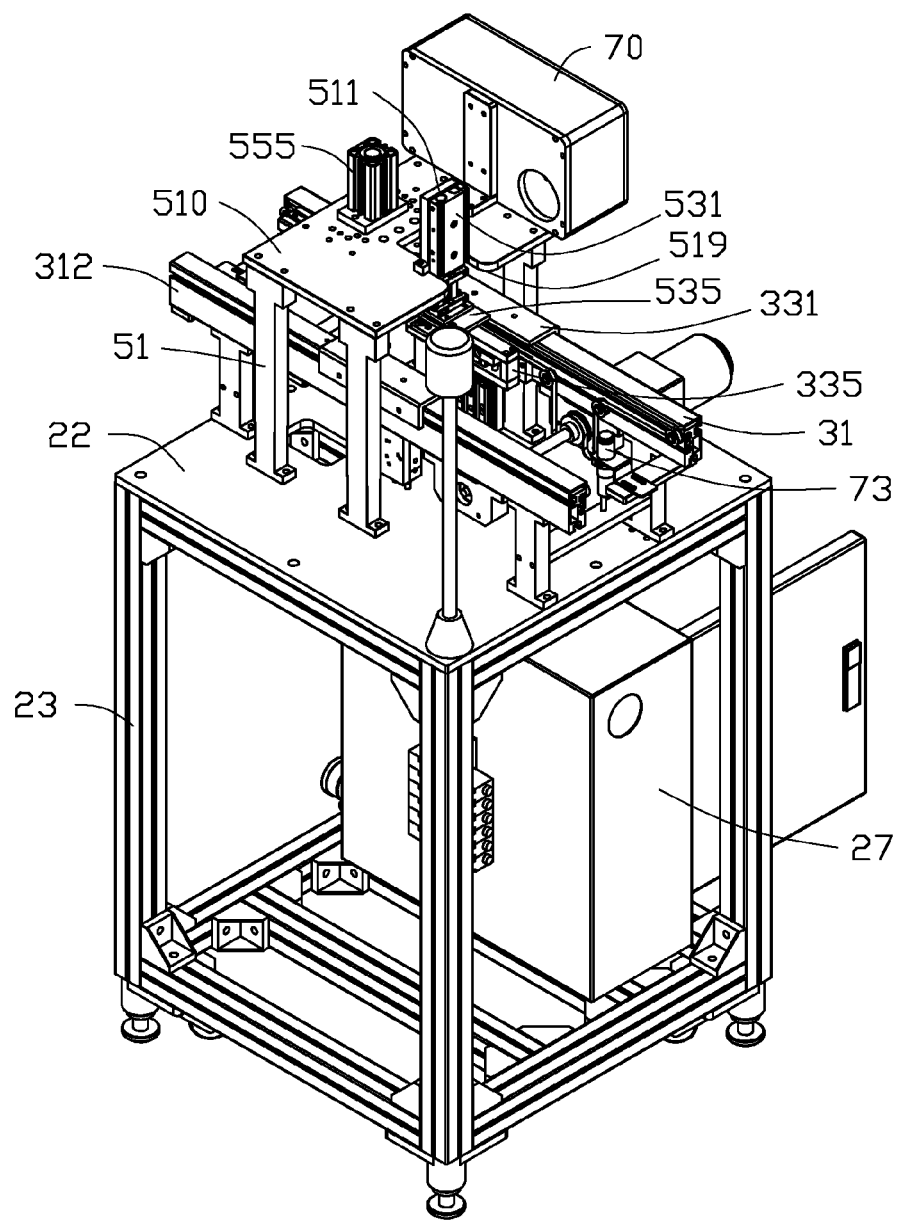
FIG. 7 is an assembled, isometric view of FIG. 1.
Figure 8:
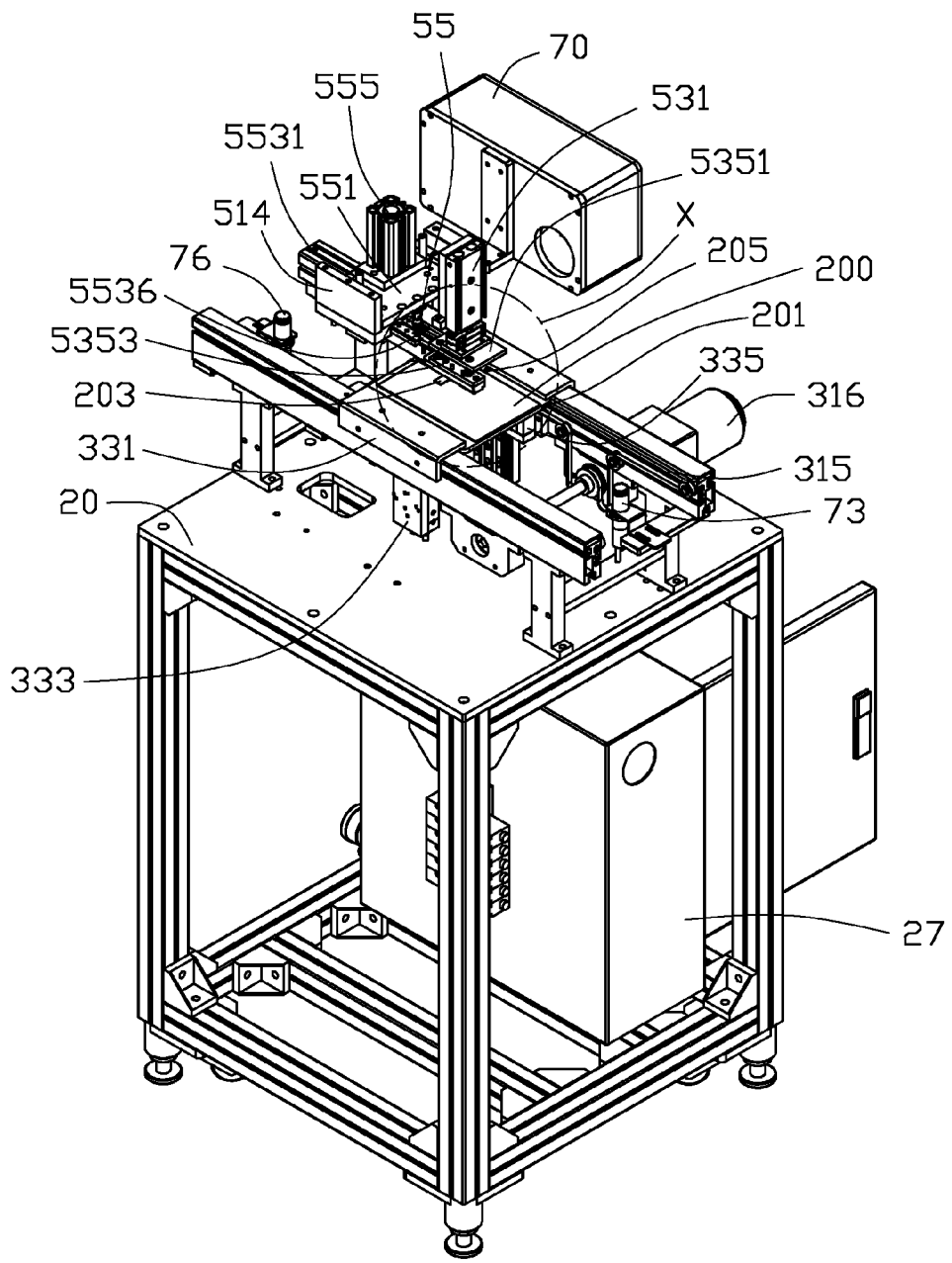
FIG. 8 is similar to FIG. 7, but portions of the detaching apparatus cutaway, showing the detaching apparatus in a first state.
Figure 9:
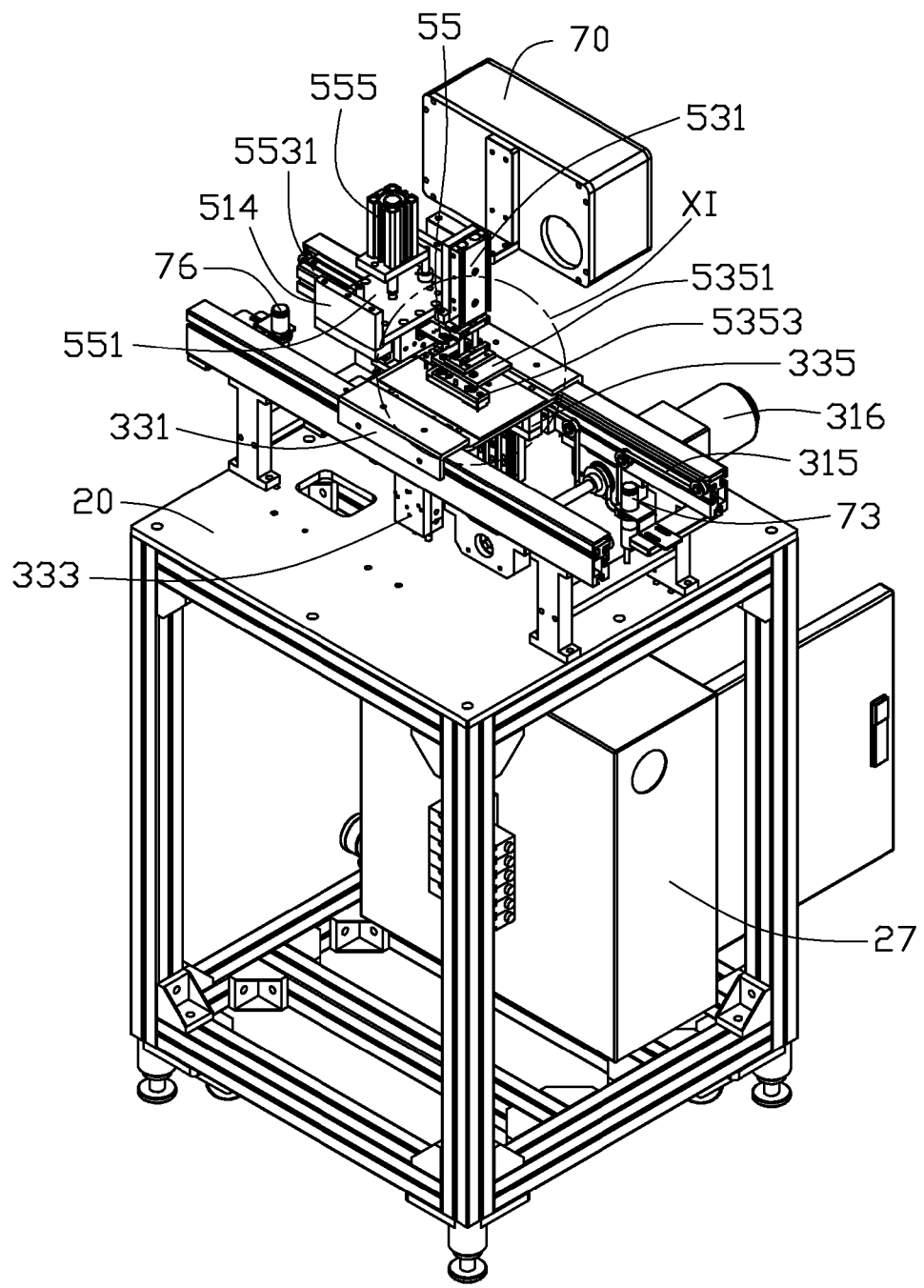
FIG. 9 is similar to FIG. 8, but showing the detaching apparatus in a second state.

FIGS. 5-6 illustrate the detaching member 55 comprising a sliding bracket 551 driven by the third cylinder 555 via a piston pin 5553, a moving block 5535 driven by a fourth cylinder 5531 via a piston pin 5553, a mounting tab 5515 attached to an upper portion of the moving block 5535, a plurality of blades 5536 attached to a lower portion of the moving block 5535 by a holding tab, and a vacuum suction cup 557 attached to the mounting tab 5515 and aligning with the blades 5536. The third cylinder 555 can drive the sliding bracket 551 to move vertically. The fourth cylinder 5531 can drive the moving block 5535 to move horizontally in the sliding bracket 551. The sliding bracket 551 comprises a sliding plate 5511, and a mounting plate 5513 perpendicularly extending down from a side of a bottom surface of the sliding plate 5511. A middle of a top surface of the sliding plate 5511 defines a fastening hole 5517.

FIGS. 1-2 illustrate the controlling device 70 is attached to an end of the installing plate 510 of the second supporting member 51 and comprises a warning lamp 77 displaying the state of the detaching apparatus 100, and an operation interface 713. The first cylinder 333, the second cylinder 531, the third cylinder 555, the fourth cylinder 5531, the driving member 316 and the driving cylinder 3171 are controlled by the controlling device 70.

FIGS. 1-9 illustrate in assembly of the detaching apparatus 100. The second cylinder 531 is attached to the mounting board 511 through a plurality of screws (not shown), the piston pin 5553 of the second cylinder 531 is received in the cutout 519, and the connecting block 5351 is located below the installing plate 510. The sliding bracket 551 is vertically slid between the connecting plates 514 of the second supporting member 51, the fastening hole 5517 aligns with the guiding hole 517, and the blades 5536 face the pressing blocks 5353. A distal end of the piston pin 5553 of the third cylinder 555 extends through the guiding hole 517 to be mounted in the fastening hole 5517 of the sliding bracket 551. A plurality of screws (not shown) extends through the though holes 518 from the bottom surface of the installing plate 510, to engage in the third cylinder 555. The second supporting member 51 is supported on the supporting plate 22 above the first supporting member 31, the detaching member 55 is located adjacent to the third sensor 75, and the locating member 53 is located adjacent to the first sensor 73. A plurality of screws (not shown) extends through the supporting poles 513 to engage in the supporting plate 22.

FIGS. 8-11 illustrate the detaching apparatus 100 in use. The tray 201 is placed on the convey belts 315 adjacent to the first sensor 73. The operation interface 713 is operated to start the detaching apparatus. The first sensor 73 transmits a signal to the controlling device 70 when the first sensor 73 sensing the tray 201. The controlling device 70 controls the driving member 316 to drive the convey belts 315 to move the tray 201 toward the abutting plates 331. When the tray 201 moves adjacent to the second sensor 76, the second sensor 76 transmits a signal to the controlling device 70, and the controlling device 70 controls the driving member 316 to stop the convey belts 315. The controlling device 70 controls the driving cylinder 3171 to drive the stopping bar 3173 to move toward the tray 201, until the stopping bar 3173 abuts against an end of the tray 201. The tray 201 are respectively located between the abutting plates 331 and the corresponding abutting blocks 335, the position pins 337 align with the corresponding position holes 205 of the tray 201, and the tray 201 aligns with the locating member 53. The controlling device 70 controls the first cylinder 333 to drive the abutting blocks 335 to move toward the tray 201, the position pins 337 are inserted in the position holes 205 of the tray 201. Then, the tray 201 is moved upward until it is sandwiched between the abutting plates 331 and the abutting blocks 335.

The controlling device 70 controls the second cylinder 531 to extend the piston pin 5553 toward the tray 201 and the connecting block 5351 moves toward the tray 201 until the pressing block 5353 abuts against the circuit board 200. The resilient members 5356 are deformed. The controlling device 70 controls the third cylinder 555 to extend the piston pin 5553 toward the tray 201, until the blades 5536 are located between the electronic component 203 and the circuit board 200. The sliding plate 5511 slides between the connecting portions 515 of the connecting plate 514, and is capable of being stopped by the extending portions 516. The controlling device 70 controls the fourth cylinder 5531 to extend the piston pin 5553 along the horizontal direction, the blades 5536 move toward the circuit board 200, until the blades 5536 is inserted between the electronic component 203 and the circuit board 200 and severs the connection therebetween. The electronic component 203 separates from the circuit board 200, and located on the blades 5536. The vacuum chuck 557 picks the electronic component 203 up.

The controlling device 70 controls the first cylinder 333, the second cylinder 531, the third cylinder 555, the fourth cylinder 5531, and the driving cylinder 3171 to move back. The abutting blocks 335 move down away from the abutting plates 331, the position pin 337 is disengaged from the position holes 205 of the tray 201 and the resilient members 5356 restore, and the tray 201 moves down to be supported on the convey belts 315. The connecting block 5351 moves up. The moving block 5535 moves toward the fourth cylinder 5531 and the sliding bracket 551 moves toward the installing plate 510, and the blades 5536 move away from the tray 201. The stopping bar 3173 moves down, to disengage from the tray 201. The electronic component 203 can fall into a recycling box when the vacuum suction cup 557 stops.

The controlling device 70 controls the driving member 316 to drive the convey belts 315 to move the tray 201 toward the second sensor 76. When the tray 201 moves adjacent to the third sensor 75, the second sensor 76 transmits a signal to the controlling device 70, and the controlling device 70 controls the driving member 316 to stop the convey belts 315 to stop moving the tray 201. The tray 201 can be detached from the first supporting member 31.

Figure 12:
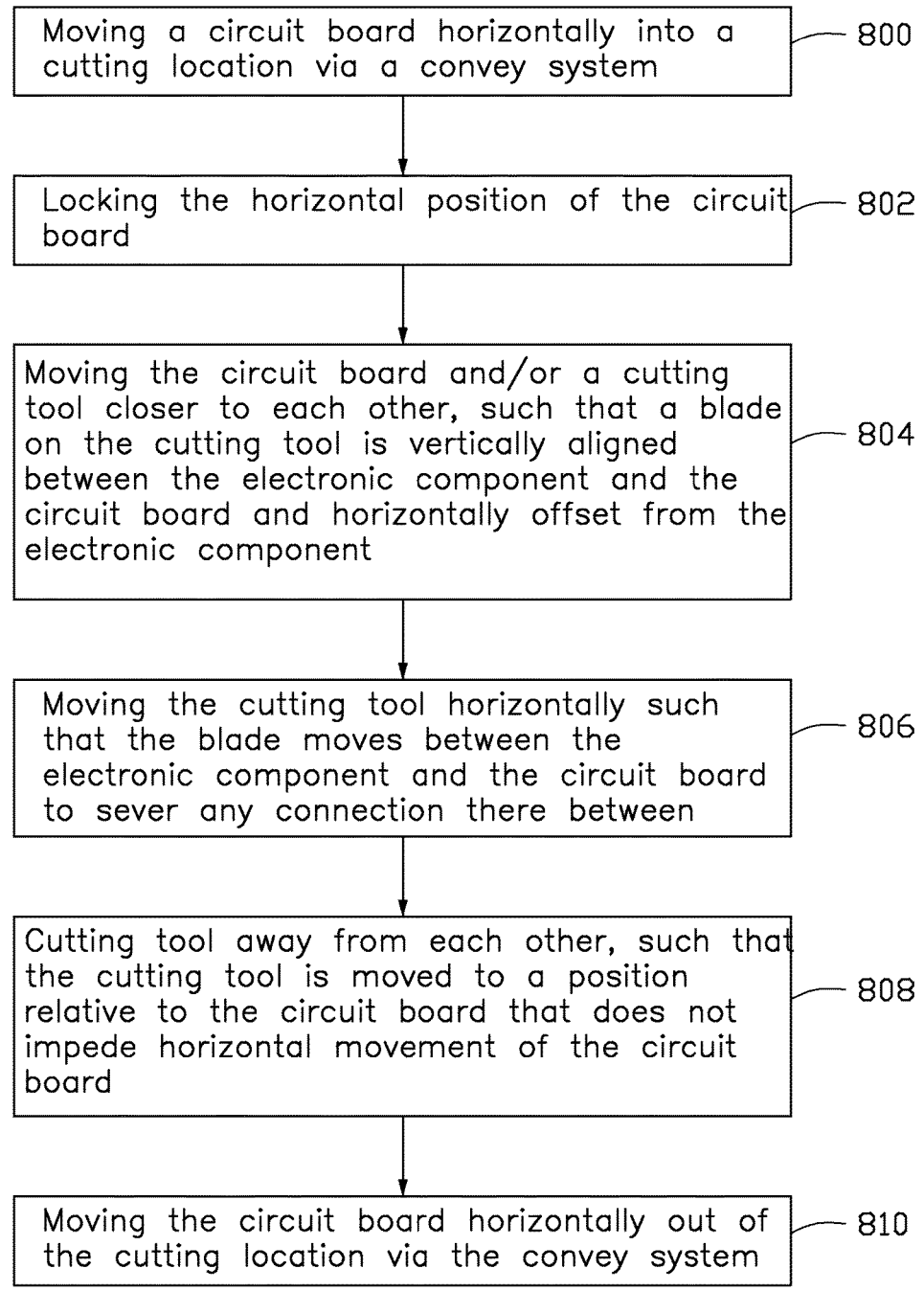
FIG. 12 is a flow chart of a detaching method of the present disclosure.

FIG. 12 illustrates a detaching method of the present disclosure. The illustrated order of blocks is illustrative only and the order of the blocks can change according to the present disclosure. Additional blocks can be added or fewer blocks may be utilized, without departing from this disclosure. The example method can begin at block 800.

At block 800, a circuit board 200 mounting on a tray 201 is horizontally moved into a cutting location via a convey system 314.

At block 802, the circuit board 200 is locked at the horizontal position via a locating member 53.

At block 804, a cutting tool such as a blade 5536 is moved to the circuit board 200, such that the blade 5536 on the cutting tool is vertically aligned between the electronic component 203 and the circuit board 200 and horizontally offset from the electronic component.

At block 806, the cutting tool horizontally such that the blade 5536 moves between the electronic component 203 and the circuit board 200 to sever any connection there between.

At block 808, the cutting tool is moved away from the circuit board 200, such that the cutting tool is moved to a position relative to the circuit board 200 that does not impede horizontal movement of the circuit board 200.

At block 810, the circuit board 200 is horizontally moved out of the cutting location via the convey system 314.

Even though numerous characteristics and advantages of the embodiments have been set forth in the foregoing description, together with details of the structure and function of the embodiments, the present disclosure is illustrative only, and changes can be made in detail, including in the matters of shape, size, and arrangement of parts within the principles of the embodiments to the full extent indicated by the broad general meaning of the terms in which the appended claims are expressed.

What is claimed is:

1. A detaching apparatus for detaching a component from a circuit board, the detaching apparatus comprising:
    a bench;
    a first supporting member attached to the bench, wherein the first supporting member comprises a pair of rails attached to the bench;
    a convey system comprising a pair of conveyor belts respectively attached to an inner side of each of the rails and driven by a driving member, the circuit board being supported on a tray, the tray being conveyed by the conveyor belts;
    a positioning member attached to the first supporting member for positioning the circuit board;
    a second supporting member attached to the bench and aligning with the first supporting member; and
    a detaching member attached to the second supporting member and comprising a sliding bracket, the sliding bracket moving vertically relative to the bench, a moving block, the moving block moving horizontally in the sliding bracket, a blade attached to the moving block, and a vacuum suction cup attached to the moving block and aligning with the blade;
    wherein the blade is moved between the component and the circuit board to separate the component from the circuit board and the vacuum suction cup picks the component up.

2. The detaching apparatus of claim 1, wherein the positioning member comprises a pair of L-shaped abutting plates respectively attached to the rails, a stopping member, and a pair of abutting blocks located between the rails, each abutting plate comprises a connecting portion attached to an outside of the rail, and an abutting portion extending perpendicularly from the connecting portion and located above the corresponding rail, the abutting portions are capable of abutting against a top of the tray, the abutting blocks are driven to move the tray vertically to sandwich the tray between the abutting blocks and the abutting portions.

3. The detaching apparatus of claim 2, wherein a position pin protrudes from a top surface of each abutting block, the tray defines two position holes for respectively receiving the position pins.

4. The detaching apparatus of claim 2, wherein the positioning member further comprises a stopping member located between the rails, the stopping member is driven to move vertically and comprises a stopping bar capable of blocking an end of the tray.

5. The detaching apparatus of claim 1, further comprising a locating member attached to the second supporting member and opposite to the detaching member, wherein a pressing block is driven to move vertically and capable of abutting against a top of the circuit board.

6. The detaching apparatus of claim 5, wherein the locating member comprises a connecting block driven by a cylinder, the pressing block located below the connecting block, a plurality of guiding pins located between the connecting block and the pressing block, and a plurality of resilient members respectively fitted about the guiding pins, an end of each guiding pin is mounted to the pressing block, and the other end of the each guiding pin is slidably connected to the connecting block.

7. The detaching apparatus of claim 1, further comprising a control device, wherein the driving member, the convey belts, the sliding bracket, the moving block, the convey system are controlled by the control device.

8. The detaching apparatus of claim 7, further comprising a first sensor, a second sensor, and a third sensor, wherein the first sensor, the second sensor are located between the rails and controlled by the control device, the first sensor and the third sensor are located near two opposite ends of the rails, the second sensor is located between the first sensor and the third sensor.

9. The detaching apparatus of claim 1, wherein the second supporting member comprises an installing plate located above the first supporting member, and two spaced and opposite connecting plates mounted to a side of a bottom surface of the installing plate, each of the two spaced and opposite connecting plate comprises a connecting portion extending down from the installing plate and an extending portion extending from a distal end of the connecting portion toward the other connecting plate, the sliding bracket is slide between the connecting portions and is capable of being stopped by the extending portions.

* * * * *